United States Patent
Pawlak et al.

(10) Patent No.: US 9,698,262 B2
(45) Date of Patent: Jul. 4, 2017

(54) VERTICAL FIN FIELD-EFFECT SEMICONDUCTOR DEVICE

(71) Applicants: IMEC VZW, Leuven (BE); GLOBALFOUNDRIES INC., Grand Cayman (KY)

(72) Inventors: Bartlomiej Pawlak, Leuven (BE); Geert Eneman, Leuven (BE)

(73) Assignees: IMEC VZW, Leuven (BE); Globalfoundries Inc., Grand Cayman (KY)

( * ) Notice: Subject to any disclaimer, the term of this patent is extended or adjusted under 35 U.S.C. 154(b) by 0 days.

(21) Appl. No.: 15/072,130

(22) Filed: Mar. 16, 2016

(65) Prior Publication Data

US 2016/0276478 A1 Sep. 22, 2016

(30) Foreign Application Priority Data

Mar. 17, 2015 (EP) .................................... 15159324

(51) Int. Cl.
*H01L 29/74* (2006.01)
*H01L 29/80* (2006.01)
*H01L 29/94* (2006.01)
*H01L 21/00* (2006.01)
*H01L 21/338* (2006.01)
(Continued)

(52) U.S. Cl.
CPC ........ *H01L 29/7827* (2013.01); *H01L 21/765* (2013.01); *H01L 29/0607* (2013.01); *H01L 29/0657* (2013.01); *H01L 29/1083* (2013.01); *H01L 29/42356* (2013.01)

(58) Field of Classification Search
CPC ......... H01L 29/66666; H01L 29/66787; H01L 29/66795; H01L 29/785; H01L 29/7827; H01L 29/41791; H01L 29/78642; H01L 27/10826; H01L 27/10879; H01L 2029/7858
USPC ........ 257/135, 220, 263, 302, 328; 438/156, 438/173, 192, 206, 212, 268
See application file for complete search history.

(56) References Cited

U.S. PATENT DOCUMENTS 6,570,229 B1 5/2003 Harada
8,609,494 B2 * 12/2013 Masuoka ................ H01L 21/84
257/268

(Continued)

OTHER PUBLICATIONS

Extended European Search Report issued on Oct. 5, 2015 in European Application No. 15159324.1.

*Primary Examiner* — Hsien Ming Lee
(74) *Attorney, Agent, or Firm* — Knobbe, Martens, Olson & Bear LLP

(57) ABSTRACT

A vertical FinFET semiconductor device and a method of forming the same are disclosed. In one aspect, the semiconductor device includes a current-blocking structure formed over a semiconductor structure and a semiconductor fin formed on the current-blocking structure. The current blocking structure includes a first layer of a first conductive type, a layer of a second conductive type over the first layer, and a second layer of the first conductive type over the layer of the second conductive type. The semiconductor fin has a doped bottom portion contacting the current-blocking structure, a doped top portion formed vertically opposite to the doped bottom portion and a channel portion vertically interposed between the doped bottom portion and the doped top portion.

18 Claims, 5 Drawing Sheets

(51) Int. Cl.

| | |
|---|---|
| *H01L 21/337* | (2006.01) |
| *H01L 29/78* | (2006.01) |
| *H01L 21/765* | (2006.01) |
| *H01L 29/06* | (2006.01) |
| *H01L 29/10* | (2006.01) |
| *H01L 29/423* | (2006.01) |

(56) References Cited

U.S. PATENT DOCUMENTS

| | | |
|---|---|---|
| 2005/0184348 A1 | 8/2005 | Youn et al. |
| 2008/0230812 A1 | 9/2008 | Disney et al. |
| 2009/0200604 A1 | 8/2009 | Chidambarrao et al. |
| 2010/0176459 A1 | 7/2010 | Wernersson et al. |
| 2012/0037953 A1 | 2/2012 | Hayano |
| 2014/0008606 A1 | 1/2014 | Hussain et al. |
| 2014/0015038 A1 | 1/2014 | Ng et al. |

\* cited by examiner

VERTICAL FIN FIELD-EFFECT SEMICONDUCTOR DEVICE

CROSS-REFERENCE TO RELATED APPLICATIONS

This application claims foreign priority to European application EP 15159324.1, filed Mar. 17, 2015, the content of which is incorporated by reference herein in its entirety.

BACKGROUND

Field

The disclosed technology generally relates to semiconductor devices, and more particularly to field effect semiconductor devices and methods of making the same.

Description of the Related Technology

The semiconductor industry continues to make unrelenting efforts to further increase the device density, or the number of devices, e.g., transistors, per unit area in integrated circuits. Recently, some device structures, e.g., transistor structures having vertical channel structures, have been proposed to further increase the device density. For instance, isolated vertical nanowires, e.g., self-aligned vertical nanowires, have been used to form transistors. Such nanowires, however, may limit the cross-sectional area of the channel of the resulting transistor. Such a reduction in the cross-sectional area of the channel can limit the performance of such devices, since some device performance parameters, e.g., the drive current or the on-current, can be directly proportional to the cross-sectional area of the channel. Furthermore, using isolated vertical nanowires may consume an undesirable amount of wafer space, leading to lower device density for a given footprint of the integrated circuit.

Very recently, attempts have been made to form fin-based vertical transistors (vertical FinFETs). An example of such a vertical Fin-FET device is disclosed in US 2009/0200604, in which a vertical Fin-FET device fabricated on a silicon-on-insulator (SOI) substrate. The fin structures are defined in the silicon layer present on the oxide insulator by etching parallel trenches in the silicon. Heavily doped silicon, e.g., N+ doped silicon is then deposited on bottom regions of the trenches and subsequently heated to diffuse the doping elements from the silicon present in the trenches into the base portion of the fin structure. Doping of the top portion of the fin is performed by ion implantation. This method has several disadvantages. First, it often requires a SOI substrate, which is a particularly expensive substrate. Second, the doping methods used for both the base and the top of the fin can introduce in homogeneities in the doping profile and/or diffuse boundaries between the doped regions (e.g., top and base portions) and the undoped region (e.g., middle channel portion) of the fin, leading to performances that are not optimal and variability from one device to another. Third, this way to dope the base of the fin often requires several processes in addition to the formation of the fin itself, such as the deposition of the doped material in the trenches, and the thermal treatment.

Thus, there is a need for new vertical fin-based transistors and methods for producing the same, to address one or more of the problems identified above.

SUMMARY OF CERTAIN INVENTIVE ASPECTS

It is an object of the present disclosure to provide good vertical fin-based transistors and methods for producing the same.

It is an advantage of transistors according to at least some embodiments of the present disclosure that they occupy a limited surface on the substrate.

It is another advantage of transistors according to at least some embodiments of the present disclosure that they provide good channel volume, especially relatively to the surface they occupy on the substrate. A good channel volume translates in general into good performances and in particular into a good drive current.

It is another advantage of transistors according to at least some embodiments of the present disclosure that they display good electrostatics, e.g. by applying the gate all around the channel or by using a thin channel body.

It is another advantage of transistors according to at least some embodiments of the present disclosure that they display homogeneously doped regions (e.g. for the drain and the source).

It is yet another advantage of transistors according to at least some embodiments of the present disclosure that a relatively small transistor footprint on the wafer is sufficient to manufacture a device with gate length as desired, a shorter one for high performance applications or a longer one for low power applications.

It is an advantage of methods according to at least some embodiments of the present disclosure that they are relatively easy and require relatively fewer processes for arriving at the field effect transistor.

For instance, some embodiments do not require deposition of a doped material in trenches adjacent to the fins and some embodiments do not require a thermal treatment to diffuse dopants in the fins. Also, implantation is not needed.

It is another advantage of methods according to at least some embodiments of the present disclosure that they do not require the use of a SOI substrate for forming the device. This translates in an economic advantage and into wafer supplier independence.

It is yet another advantage of methods according to at least some embodiments of the present disclosure that they permit obtaining transistors displaying sharp boundaries between doped regions (e.g. drain, source) and undoped regions (e.g. channel region).

The above objective is accomplished by a method and device according to the present disclosure.

In a first aspect, the present disclosure relates to a vertical Fin-FET semiconductor device comprising:
 a. a semiconductor substrate,
 b. a current-blocking structure disposed on the semiconductor substrate and comprising:
  i. a first layer of a first conductive type,
  ii. a layer of a second conductive type overlying the first layer,
  iii. a second layer of the first conductive type overlying the layer of the second conductive type, and
 c. at least one vertical semiconductor fin disposed on the current-blocking structure, wherein said fin has a first side and a second side, substantially parallel and opposite to each other, wherein said fin comprises the following portions:
  i. a doped bottom portion contacting the second layer of the current-blocking structure,
  ii. a doped top portion opposite to the doped bottom portion, and
  iii. a channel portion present between the doped bottom portion and the doped top portion.

In a second aspect, the present disclosure relates to a method for manufacturing a vertical Fin-FET semiconductor device according to the first aspect, comprising the processes of:

a. providing a semiconductor substrate,
b. disposing a current-blocking structure on the semiconductor substrate, said structure comprising:
   i. a first layer of a first conductive type,
   ii. a layer of a second conductive type overlying the first layer,
   iii. a second layer of the first conductive type overlying the layer of the second conductive type, and
c. disposing at least one vertical semiconductor fin on the current-blocking structure, wherein said fin has a first side and a second side, substantially parallel and opposite to each other, wherein said fin comprises the following portions:
   i. a doped bottom portion contacting the second layer of the current-blocking structure,
   ii. a doped top portion opposite to the doped bottom portion, and
   iii. a channel portion present between the doped bottom portion and the doped top portion.

Particular embodiments are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, and features and advantages of various embodiments will become apparent from the following detailed description, taken in conjunction with the accompanying drawings, which illustrate, by way of examples, the principles of the disclosed technology. The detailed description is intended to provide various embodiments, without limiting in any way the scope of the inventive aspects included therein. The reference figures quoted below refer to the attached drawings.

Figure 1:
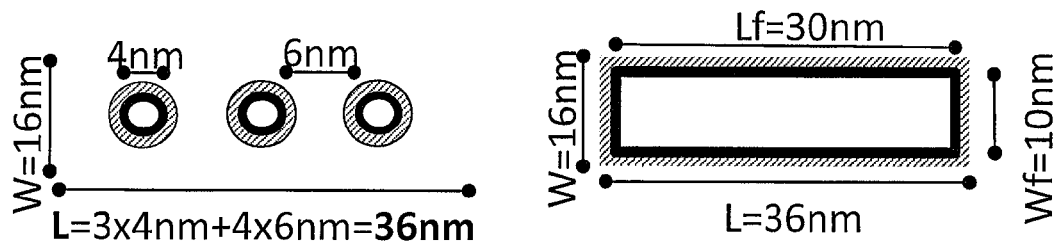
FIG. 1 shows horizontal cross-sections comparing the footprint of vertical nanowires according to the prior art (left) against the footprint of a vertical fin as use in the present disclosure (right).

In the different figures, the same reference signs refer to the same or analogous elements.

DETAILED DESCRIPTION OF CERTAIN ILLUSTRATIVE EMBODIMENTS

The disclosed technology will be described with respect to particular embodiments and with reference to certain drawings but is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions in the particular embodiments.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Similarly, it is to be noticed that the term "connected", also used in the claims, should not be interpreted as being restricted to direct connections only. Thus, the scope of the expression "a device A connected to a device B" should not be limited to devices or systems wherein an output of device A is directly connected to an input of device B. It means that there exists a path between an output of A and an input of B which may be a path including other devices or means. In the present disclosure, "connected" typically refers to "electrically connected"

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the disclosure, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed embodiment requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of the disclosed technology.

Furthermore, while some embodiments described herein include some but not other features included in other embodiments, combinations of features of different embodiments are meant to be within the scope of the disclosed technology, and form different embodiments, as would be understood by those in the art. For example, in the following claims, any of the claimed embodiments can be used in any combination.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

The following terms are provided solely to aid in the understanding of the disclosure.

As used herein and unless provided otherwise the term "doped" refers to a dopant concentration of at least $10^{18}$ cm$^{-3}$.

As used herein and unless provided otherwise the term "undoped" refers to a dopant concentration of less than $10^{17}$ cm$^{-3}$.

The disclosed technology will now be described by a detailed description of several embodiments. It is clear that other embodiments of the disclosed technology can be configured according to the knowledge of persons skilled in the art without departing from the technical teaching of the disclosed technology, the embodiments being limited only by the terms of the appended claims.

Reference will be made to transistors. These are three-terminal devices having a first main electrode such as a drain, a second main electrode such as a source and a control electrode such as a gate for controlling the flow of electrical charges between the first and second main electrodes.

It will be clear for a person skilled in the art that the present disclosure is also applicable to similar devices that can be configured in any transistor technology.

The first aspect of the disclosed technology relates to a vertical fin-shaped field effect transistor (hereinafter FinFET) semiconductor device. A FinFET is a field effect transistor having a fin-like channel. If we consider a typical channel as being a rectangular parallelepiped having a width, a length and a height, wherein the width and the length are substantially parallel to the substrate and the height is substantially perpendicular to the substrate, a fin-like channel is higher than wide. A vertical FinFET has its source, channel and drain arranged vertically. For instance, the drain (or source) electrode can contact the bottom of the fin and the source (or drain) electrode can contact the top of the fin, wherein the bottom of the fin is the part of the fin closest to the substrate. As used herein, whether a feature is substantially parallel or substantially perpendicular depends on the context, e.g., the processes employed to fabricate the feature. For example, a fin structure may be fabricated using a dry etch technique to have two surfaces, e.g., opposing sides, that are aimed to be ideally parallel to each other. However, in practice, such surfaces may depart from being ideally parallel because of the nature of semiconductor fabrication techniques used to fabricate such structure. For example, as a result of etch chemistry, a sidewall resulting from an etch process may have a slope that departs from being ideally vertical or ideally horizontal. In this connection, two surfaces that may be referred to herein as being parallel or substantially parallel may have a relative angle between them of about 170° to about 190°, about 175° to about 185° or about 177° to about 183°. Similarly, two surfaces that may be referred to herein as being perpendicular or substantially perpendicular may have a relative angle between them of about 80° to about 100°, about 85° to about 95°, or about 87° to about 93°.

The vertical FinFET semiconductor device of the first aspect comprises a semiconductor substrate. Any semiconductor substrate is suitable, including a crystalline substrate such as a monocrystalline substrate. For instance, a Si substrate (e.g. a Si bulk wafer), a Ge substrate, a III-V substrate or a $Si_xGe_{1-x}$, substrate are suitable. Stacked semiconductor substrates are also suitable wherein the top layer is a semiconductor such as Si, Ge, $Si_xGe_{1-x}$, or a III-V material. The top layer is preferably monocrystalline, according to some embodiments. An example of stacked semiconductor substrate is $Si/Si_xGe_{1-x}$. As used herein and unless provided otherwise, x in the formula $Si_xGe_{1-x}$, is from 0 to 1. A typical substrate would be a monocrystalline Si wafer. An advantage of using a monocrystalline substrate is that the current blocking structure and the at least one fin can be built by epitaxial growth.

The vertical FinFET semiconductor device of the first aspect further comprises a current-blocking structure. The current-blocking structure prevents current leakage from the fin to the substrate. The particular current-blocking structure of the present disclosure achieves this by introducing an n-p and a p-n junction between the substrate and the fin. In practice, this may be realized with a current-blocking structure comprising a first layer of a first conductive type, a layer of a second conductive type overlaying the first layer, and a second layer of the first conductive type overlying the layer of the second conductive type. If the first conductive type is a p-type semi-conductor, the second conductive type will be an n-type semiconductor, and vice versa. Preferably, the first conductive type is opposite to the conductive type of the doped bottom region of the fin. This creates a p-n junctions participating in the blocking of the current. For instance, the first conductive type can be n-type and the doped bottom region of the fin can be p-type. Typically, the doped bottom region and the doped top region of the fin are of the same conductive type. However, if the device is a tunnel FinFET, the doped bottom region and the doped top region of the fin are of opposite conductive type. The layers of the current-blocking structure are preferably semiconducting crystalline layers aligned epitaxially with the substrate and with each other.

The vertical FinFET semiconductor device of the first aspect comprises at least one vertical semiconductor fin disposed on the current-blocking structure. The fin has a height perpendicular to the substrate, and a width and a length substantially parallel to the substrate. The two largest faces of the fin have each an area which is obtained by multiplying the length of the fin with the height of the fin.

These two faces are hereinafter referred to as the first and the second side. As used herein, the thickness of a fin refers to the distance, e.g., the shortest distance, between the two opposing sides of the fin. These first and second sides are substantially parallel and opposite to each other. Where the first and second sides are not ideally parallel to each other as described above, the thickness of a fin can refer to the distance between the two opposing sides of the fin at a midpoint of the fin height.

In embodiments (e.g. in the case of a rectangular parallelepiped fin), the fin may also be described as being delimited by the following faces:
  i. a bottom face at an interface of the fin with the current-blocking structure,
  ii. a top face opposite to the bottom face,
  iii. a front face and a back face, both projecting upward from the current-blocking structure and opposite to each other,
  iv. a first side face and a second side face (herein referred as a first side and a second side respectively), substantially parallel and opposite to each other, each side face having a larger area than both the front face and the back face, both side faces projecting upward from the current-blocking structure.

Preferably, the bottom face and the top face are substantially parallel to each other and substantially parallel to the substrate. Preferably the front face and the back face are substantially parallel to each other and perpendicular to the substrate. Preferably, the first side and the second side are substantially parallel to each other and perpendicular to the substrate.

The fin comprises a doped bottom portion contacting the current-blocking structure, a doped top portion opposite to the doped bottom portion, and a channel portion present between the doped bottom portion and the doped top portion. The channel portion is typically undoped (e.g., for typically FinFET devices or for tunnel FinFET devices) but in some embodiments it can be doped (e.g. in junctionless FinFET devices). In junctionless FinFET devices the channel can have the same doping concentration and the doping can be of the same conductive type than both the doped bottom portion and the doped top portion (e.g. at least $10^{18}$ cm$^{-1}$). In this case, the doping concentration is the same over the whole height of the fin.

The doped bottom portion typically comprises the bottom face of the fin. The width (i.e. the thickness) of the fin can for instance be from 2 to 14 nm or from 3 to 14 nm. The length of the fin can for instance be from 15 to 60 nm and the height of the fin can be for instance from 15 to 60 nm.

In embodiments of the first aspect, the vertical semiconductor fin may have a thickness (i.e. a width) of from 2 to 10 nm, more preferably from 2 to 6 nm. A fin having such a thickness is sometimes referred to as a nanosheet. Such a thickness is advantageous for several reasons. First, it takes very little place laterally on the substrate. Second, it has a decent channel volume in cross-section for good on-state currents. Third, such a thickness enables the use of a gate structure (electrode and dielectric) contacting only one side of the dielectric while keeping very good electrostatics. This saves still more space laterally.

For instance, in these embodiments, the device may further comprise a gate electrode disposed as follow:
  a. along the channel portion of the first side,
  b. not along the second side, and
  c. separated from the fin by a gate dielectric.

Third, such a thickness can enable the use of a source or drain electrode contacting only one side of the dielectric, again with an appreciable gain of space. For instance, in embodiments where the fin has a thickness of from 2 to 10 nm, the device may further comprise a bottom electrode (e.g. drain) disposed as follow:
  a. on part of the second layer,
  b. contacting the second side and the doped bottom portion of the fin, and
  c. not along the first side.

Finally, at such small thickness some degree of quantum confinement may be observed, thereby increasing current density.

In embodiments of the first aspect, the device may comprise a gate electrode disposed along the channel part of the fin and surrounding the fin, and separated from said fin by a gate dielectric. In embodiments (e.g. in the case of a rectangular parallelepiped fin), the gate electrode and the gate dielectric may be surrounding the first side face, the second side face, the front face, and the back face of the fin.

This permits very good electrostatic for all fin thicknesses.

In embodiments, the device may comprise a plurality of semiconductor fins sharing a common gate electrode, a common drain electrode, and a common source electrode. This permits to have a field effect transistor having multiple channels. This is advantageous as it reduces the complexity of the device while increasing the channel current driving capability. These plurality of fins are typically substantially parallel to each other. For instance, two, three or four fins can be used.

In embodiments of the first aspect, the device may comprise a gate contact connecting to the gate electrode and a bottom (e.g. drain) contact connecting to the bottom (e.g. drain) electrode, wherein the gate contact and the bottom (e.g. drain) contact are situated on opposite sides of the fin. This configuration permits very good separation between the gate electrode and the bottom electrode. In alternative embodiments of the first aspect, the device may comprise a gate contact connecting to the gate electrode and a bottom (e.g. drain) contact connecting to the bottom (e.g. drain) electrode, wherein the gate contact and the bottom contact are situated on a same side of the fin. Yet in other embodiments of the first aspect, the device may comprise a gate contact connecting to the gate electrode and a bottom (e.g. drain) contact connecting to the bottom (e.g. drain) electrode, wherein the gate contact is situated on a side of the fin and the bottom contact is situated in the prolongation of the length of the fin.

In embodiments of the first aspect, the fin and the substrate may each have a crystalline structure and said crystalline structures may be epitaxially aligned. Such a structure can be obtained by epitaxial growth of the current-blocking structure on the substrate, followed by epitaxial growth of the at least one fin on the current-blocking structure.

In embodiments, the doped portions of the at least one fin may be homogeneously doped.

In embodiments, the boundaries between the doped portions (e.g. source or drain) and the undoped portion (e.g. channel) may be sharp (e.g. abrupt). In other words, substantially no gradient of dopant is present at the boundaries between the doped portions and the undoped portion. In embodiments, the concentration of dopant goes from less than $10^{17}$ cm$^{-3}$ to at least $10^{18}$ cm$^{-3}$ in the space of one nm. This very favourable situation is made possible by the epitaxial growth of the fin that can be constructed layer by layer with a very good vertical control of its composition.

Preferably, a same semiconductor material is used for the substrate, the layers of the current-blocking structure and the fin. In that case, only the level and nature of doping is adapted. This permit to have good lattice matching between the layers and enables therefore good epitaxial growth. The substrate is preferably undoped. Just like for the channel part of the fin, it is most typically used with its intrinsic level of doping of lower than $10^{17}$ cm$^{-1}$.

In a second aspect, the present disclosure relates to a method for manufacturing a vertical FinFET semiconductor device according to any embodiment of the first aspect, comprising the processes of:
 a. Providing a semiconductor substrate,
 b. Disposing a current-blocking structure on the semiconductor substrate, said structure comprising:
   i. a first layer of a first conductive type,
   ii. a layer of a second conductive type overlying the first layer,
   iii. a second layer of the first conductive type overlying the layer of the second conductive type, and
 c. disposing at least one vertical semiconductor fin on the current-blocking structure, wherein said fin has a first side and a second side, substantially parallel and opposite to each other, wherein said fin comprises the following portions:
   i. a doped bottom portion contacting the second layer of the current-blocking structure,
   ii. a doped top portion opposite to the doped bottom portion, and
   iii. a channel portion present between the doped bottom portion and the doped top portion.

This method has the advantage of being relatively easy and may require relatively fewer processes compared to prior art methods.

In embodiments of the second aspect, disposing said current-blocking structure may comprise growing said current-blocking structure epitaxially on the semiconductor substrate wherein disposing at least one vertical semiconductor fin on the current-blocking structure comprises growing said at least one vertical semiconductor fin epitaxially on the current-blocking structure.

Epitaxial growth is enabled by the choice of the current-blocking structure. It has many advantages such as allowing an excellent control of the doping profile along the height of the fin (i.e. the length of the channel). In particular, very homogeneous doping within a portion and very sharp transitions between doped and undoped portions are achieved. The very high control of the doping profile achievable by epitaxial growth permits to achieve low device to device performance variability. A determination of whether a fin or a current blocking structure has been grown epitaxially or not can be made using analysis tools such as cross-sectional transmission electron microscopy (TEM).

Growing the fin epitaxially on the current-blocking structure can be achieved in various ways already well known by the person skilled in the art for growing fins on monocrystalline substrates.

For instance, the fin can be formed epitaxially by using the ultimate-ART (Aspect Ratio Trapping) approach. This approach may comprise the processes of providing a barrier layer (e.g. SiN) on the current-blocking structure; providing a sacrificial layer (e.g. SiO$_2$) on the barrier layer; providing a second barrier layer on the sacrificial layer, wherein the total thickness of the sacrificial layer and the two barrier layers is equal to the height of the fin one wishes to grow; forming a trench through the sacrificial layer and the two barrier layers and stopping on the current-blocking structure, wherein the length of the trench correspond to the length of the fin to be formed; growing the fin epitaxially in the trench (e.g. by CVD or MOCVD) thereby forming the fin. Further processes may comprise chemical mechanical planarization, removal of at least part of the top barrier layer in order to have access to the sacrificial layer, and replacing the sacrificial layer by a gate dielectric.

As another example, the fin can be formed epitaxially by using dry-etch. This approach may comprise the processes of growing a blanket semiconductor layer epitaxially on the current-blocking structure up to a thickness corresponding to the height desired for the fin, providing patterning layers on the blanket layer, providing a dummy fin on the patterning layers, dry-etching the structure vertically from the top thereby transferring the shape of the dummy fin into the blanket layer.

As yet another example, the fin can be formed epitaxially by using a bottom-up III-V epi-growth approach in a pre-defined template. This approach may comprise the processes of providing a template on the current-blocking structure, said template comprising an opening which length and width correspond to the length and width of the fin to be grown, providing an appropriate catalyst in the opening, and growing epitaxially a III-V fin until the desired height for the fin is achieved.

FIG. 1 illustrates the space on a substrate typically occupied by isolated vertical nanowires according to the prior art (left) and by a fin (right) as used in various embodiments disclosed herein. From these horizontal cross-sections, it is clear that for a same available space on a substrate (here 16×36 nm), a vertical fin provides a much larger channel cross-section than do vertical nanowires. The channel cross-section provided by the nanowires is equal to the number of nanowires (three) multiplied by the surface of one nanowire channel cross-section ($\pi(4$ nm$/2)^2$). This is equal to 4 nm$^2\cdot\pi$. The channel cross-section provided by the fin is equal to the width of the fin (10 nm) multiplied by the length of the fin (30 nm). This is equal to 300 nm$^2$. The ratio between the fin channel cross-section and the channel cross-section provided by the nanowires is $300/(12\cdot\pi)$, which is about 8. In the present example, it can be assumed that due to improved electrostatics, the current density that can be transported by the nanowires could be about 25% higher than the current density that can be transported by the fin. As a result, in this example, the on-state current that a vertical FinFET can offer is evaluated at 6.4 times (i.e. 8/1.25) the on-state current that vertical nanowires can offer for an identical FET footprint. This evaluation is of course footprint sensitive but it illustrates well the considerable advantage provided by a vertical FinFET when compared to vertical nanowires.

Figure 2:
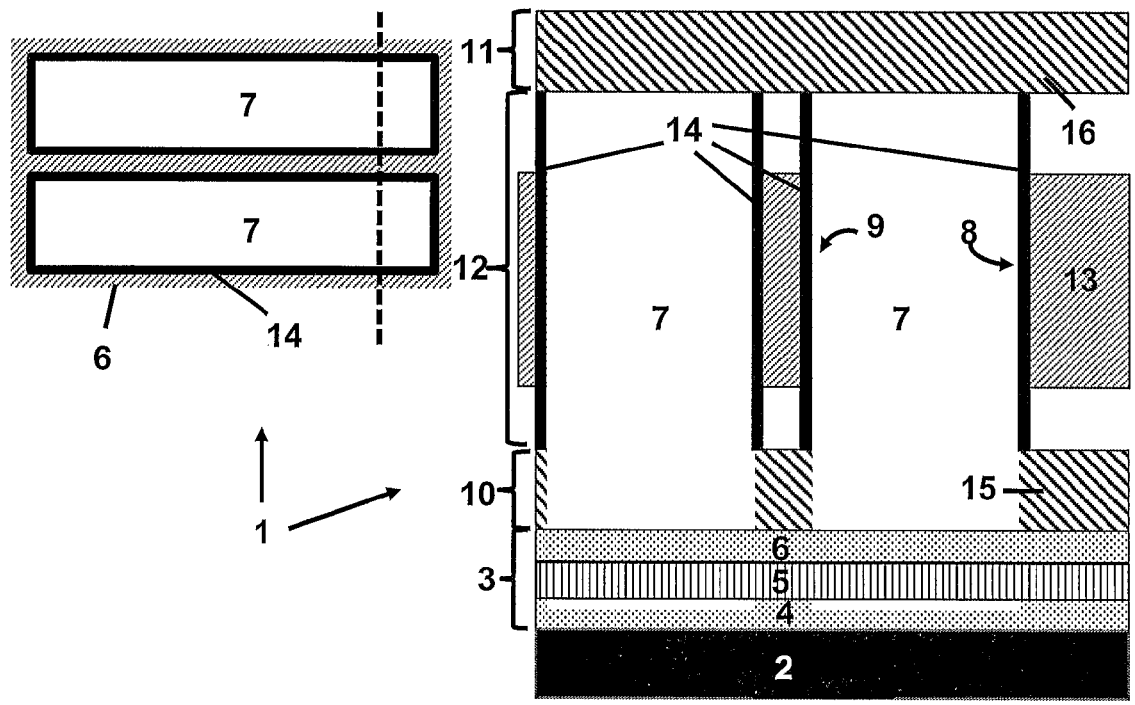
FIG. 2 is a horizontal cross-section (left) and a vertical cross-section (right) of an embodiment of the present disclosure.

FIG. 2 shows two views on an embodiment of the disclosed technology. On the left side of FIG. 2, a horizontal cross-section of a vertical FinFET semiconductor device 1) according to an embodiment of the disclosed technology is shown. The dashed line represents the cutting plane used to obtain the vertical cross-section represented on the right side of FIG. 2. The vertical FinFET semiconductor device 1 of FIG. 2 comprises a semiconductor substrate 2 (preferably a monocrystalline substrate) and a current-blocking structure 3 disposed on the semiconductor substrate. The current-blocking structure 3 consists in a first layer 4 of a first conductive type (e.g. n-type), a layer 5 of a second conductive type (e.g. p-type) overlaying the first layer 4, and a second layer 6 of the first conductive type (e.g. n-type) overlying the layer 5 of the second conductive type. The device 1 further comprises a plurality of vertical semiconductor fins 7 disposed on the current-blocking structure 3.

Each fin has a first side 8 and a second side 9, substantially parallel and opposite to each other. Each fin 7 comprises a doped bottom portion 10 contacting the current-blocking structure 3, a doped top portion 11 opposite to the doped bottom portion 10, and an undoped portion 12 present between the doped bottom portion 10 and the doped top portion 11. The doped portions 10, 11 are preferably homogeneously doped and the boundaries between doped portions 10, 11 and the undoped portion 12 are preferably sharp. The plurality of semiconductor fins 7 share a same gate electrode 13, a same drain electrode 15, and a same source electrode 16. The gate electrode 13 is separated from each fin 7 by a dielectric 14. The fins 7 are substantially parallel to each other.

Figure 3:
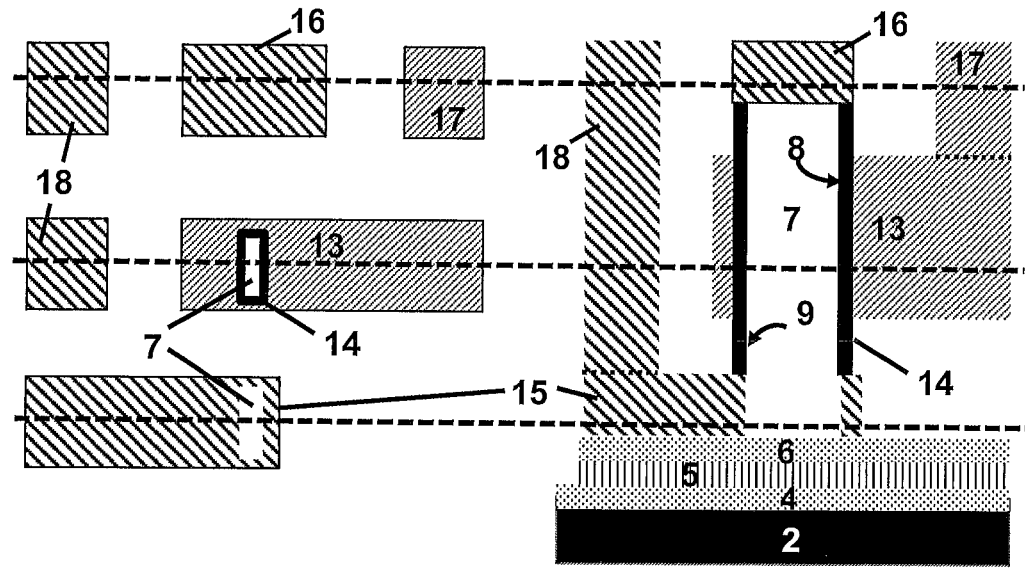
FIG. 3 is a vertical cross-section (right) and three horizontal cross-sections (left) of another embodiment of the present disclosure.

FIG. 3 shows two views on another embodiment of the present disclosure. On the right side of FIG. 3, a vertical cross-section of a vertical FinFET semiconductor device 1 according to an embodiment of the present disclosure is shown. The dashed lines represent three cutting planes used to obtain the three horizontal cross-sections represented on the left side of FIG. 3. The fin 7 on both sides of FIG. 3 is not represented at the same scale. The vertical FinFET semiconductor device 1 of FIG. 3 comprises a semiconductor substrate 2 and a current-blocking structure 3 disposed on the semiconductor substrate. The current-blocking structure 3 consists in a first layer 4 of a first conductive type, a layer 5 of a second conductive type overlaying the first layer 4, and a second layer 6 of the first conductive type overlying the layer 5 of the second conductive type. The device 1 further comprises a vertical semiconductor fin 7 disposed on the current-blocking structure 3. The fin has a first side 8 and a second side 9, substantially parallel and opposite to each other. The fin 7 comprises a doped bottom portion 10 contacting the current-blocking structure 3, a doped top portion 11 opposite to the doped bottom portion 10, and an undoped portion 12 present between the doped bottom portion 10 and the doped top portion 11. These portions are positioned as indicated in FIG. 2. The vertical FinFET semiconductor device 1 further comprises a gate electrode 13 disposed along an undoped part of the fin 7 and surrounding the fin 7, and separated from said fin 7 by a gate dielectric 14. The vertical FinFET semiconductor device 1 further comprises a gate contact 17 connecting to the gate electrode 13, and a drain contact 18 connecting to the drain electrode 15, wherein the gate contact 17 and the drain contact 18 are situated on opposite sides of the fin 7. The fin 7 and the substrate 2 have each a crystalline structure and said crystalline structures are epitaxially aligned.

Figure 4:
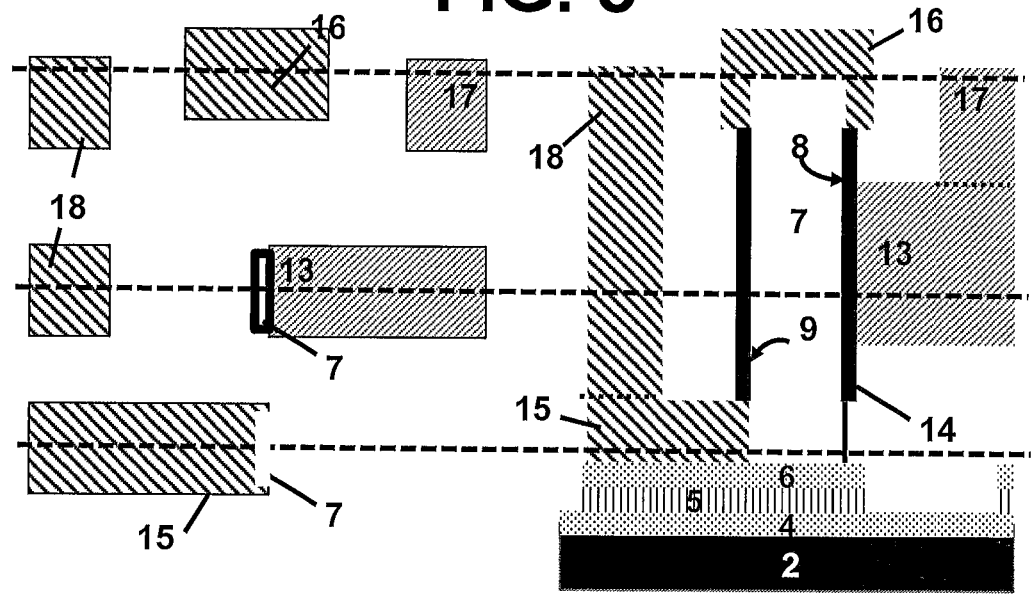
FIG. 4 is a vertical cross-section (right) and three horizontal cross-sections (left) of another embodiment of the present disclosure.

FIG. 4 shows two views on another embodiment of the present disclosure. On the right side of FIG. 4, a vertical cross-section of a vertical FinFET semiconductor device 1 according to an embodiment of the present disclosure is shown. The dashed lines represent three cutting planes used to obtain the three horizontal cross-sections on the left side of FIG. 4. The fins 7 on both sides of FIG. 4 are not represented at the same scale. The vertical FinFET semiconductor device of FIG. 4 is similar to the device of FIG. 3 except that its vertical semiconductor fin 7 is very thin with a thickness of from 1 to 5 nm. The fin can therefore be called a nanosheet. The device 1 further comprises a gate electrode 13 disposed along an undoped part of the first side 8, not along the second side 9, and separated from the fin by a gate dielectric 14. The low thickness of the nanosheet permits to dispose the gate electrode only along one of both sides 8, 9 while maintaining sufficient electrostatic. This permits to spare place on the other side of the fin making it easier to place the drain electrode 15 and contact 18. The drain electrode 15 is disposed in such a way as to contact the second side 9 and the doped bottom portion 10 of the fin 7. It is not along the first side 8.

Figure 5:
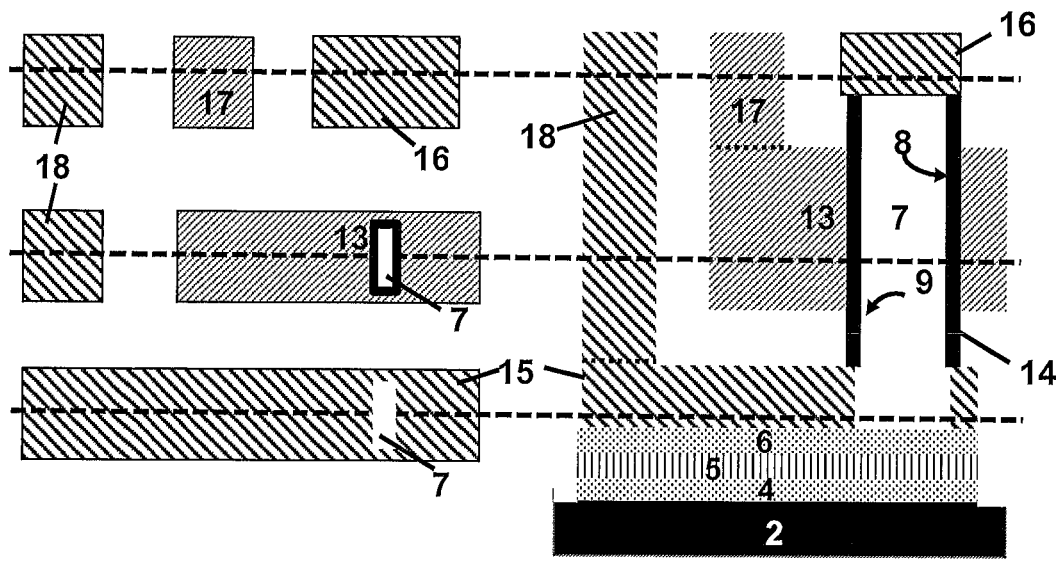
FIG. 5 is a vertical cross-section (right) and three horizontal cross-sections (left) of another embodiment of the present disclosure.

FIG. 5 shows two views on another embodiment of the present disclosure. On the right side of FIG. 5, a vertical cross-section of a vertical FinFET semiconductor device 1 according to an embodiment of the present disclosure is shown. The dashed lines represent three cutting planes used to obtain the three horizontal cross-sections on the left side of FIG. 5. The fins 7 on both sides of FIG. 5 are not represented at the same scale. The vertical FinFET semiconductor device of FIG. 5 is similar to the device of FIG. 3 except that the gate contact 17 and the drain contact 18 are situated on a same side of the fin 7.

Figure 6:
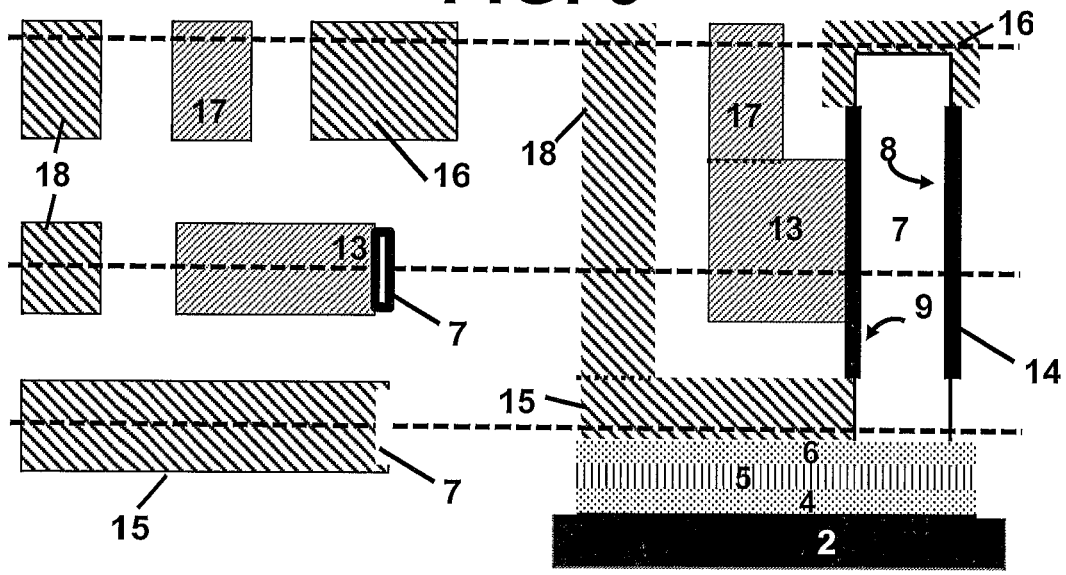
FIG. 6 is a vertical cross-section (right) and three horizontal cross-sections (left) of another embodiment of the present disclosure.

FIG. 6 shows two views on another embodiment of the present disclosure. On the right side of FIG. 6, a vertical cross-section of a vertical FinFET semiconductor device 1 according to an embodiment of the present disclosure is shown. The dashed lines represent three cutting planes used to obtain the three horizontal cross-sections on the left side of FIG. 6. The fins 7 on both sides of FIG. 6 are not represented at the same scale. The vertical FinFET semiconductor device of FIG. 6 is similar to the device of FIG. 5 except that its vertical semiconductor fin 7 is very thin with a thickness of from 1 to 5 nm and that the gate electrode is only along one of both sides 8, 9. The fin can therefore be called a nanosheet. The device 1 further comprises a gate electrode 13 disposed along an undoped part of the second side 9, not along the first side 8, and separated from the fin by a gate dielectric 14. The presence of the dielectric on the first side is optional. The low thickness of the nanosheet permits to dispose the gate electrode only along one of both sides 8, 9 while maintaining sufficient electrostatics. The drain electrode 15 is disposed in such a way as to contact the second side 9 and the doped bottom portion 10 of the fin 7. It is not along the first side 8. The gate contact 17 and the drain contact 18 are therefore situated on a same side of the fin 7.

Figure 7:
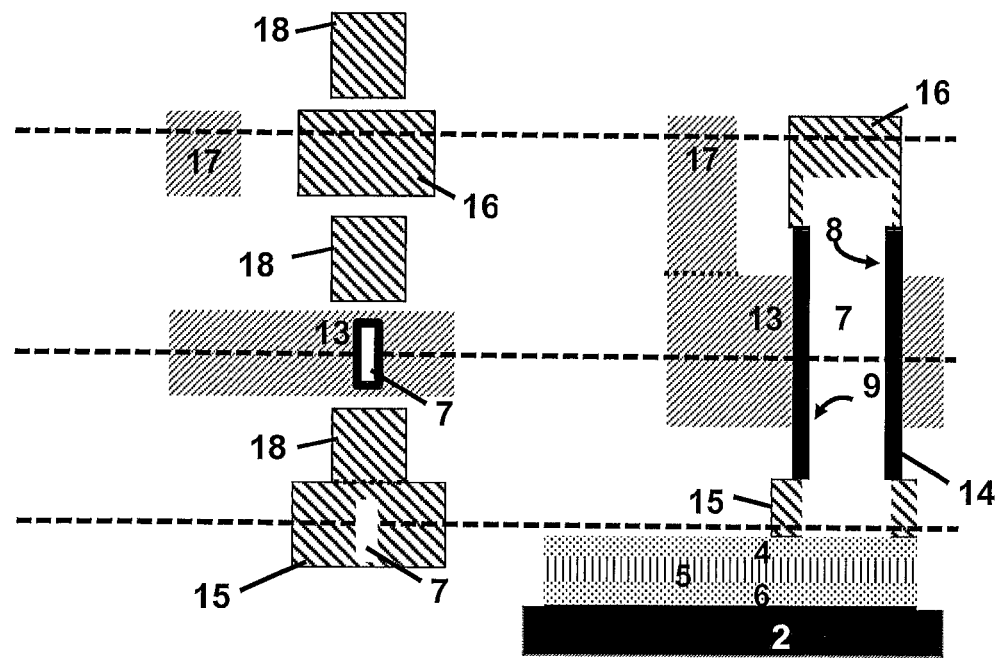
FIG. 7 is a vertical cross-section (right) and three horizontal cross-sections (left) of another embodiment of the present disclosure.

FIG. 7 shows two views on another embodiment of the present disclosure. On the right side of FIG. 7, a vertical cross-section of a vertical FinFET semiconductor device 1 according to an embodiment of the present disclosure is shown. The dashed lines represent three cutting planes used to obtain the three horizontal cross-sections on the left side of FIG. 7. The fins 7 on both sides of FIG. 7 are not represented at the same scale. The vertical FinFET semiconductor device of FIG. 7 is similar to the device of FIG. 3 except that the gate contact 17 is situated on a side of the fin 7 and the drain contact 18 is situated in the prolongation of the length of the fin 7.

Figure 8:
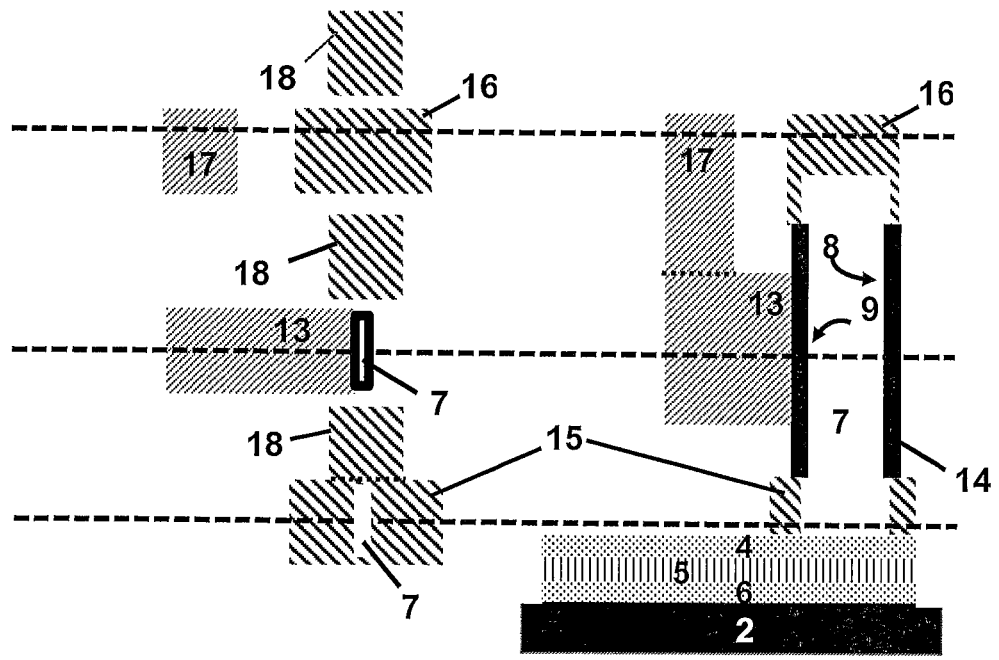
FIG. 8 is a vertical cross-section (right) and three horizontal cross-sections (left) of yet another embodiment of the present disclosure.

FIG. 8 shows two views on another embodiment of the present disclosure. On the right side of FIG. 8, a vertical cross-section of a vertical FinFET semiconductor device 1 according to an embodiment of the present disclosure is shown. The dashed lines represent three cutting planes used to obtain the three horizontal cross-sections on the left side of FIG. 8. The fins 7 on both sides of FIG. 8 are not represented at the same scale. The vertical FinFET semiconductor device of FIG. 8 is similar to the device of FIG. 3 except that the gate contact 17 is situated on a side of the fin 7 and the drain contact 18 is situated in the prolongation of the length of the fin 7. Another difference is that its vertical semiconductor fin 7 is very thin with a thickness of from 2 to 10 nm. The fin can therefore be called a nanosheet. The device 1 further comprises a gate electrode 13 disposed along an undoped part of the second side 9, not along the first side 8, and separated from the fin by a gate dielectric 14.

The low thickness of the nanosheet permits to dispose the gate electrode only along one of both sides 8, 9 while maintaining sufficient electrostatics.

Figure 9:
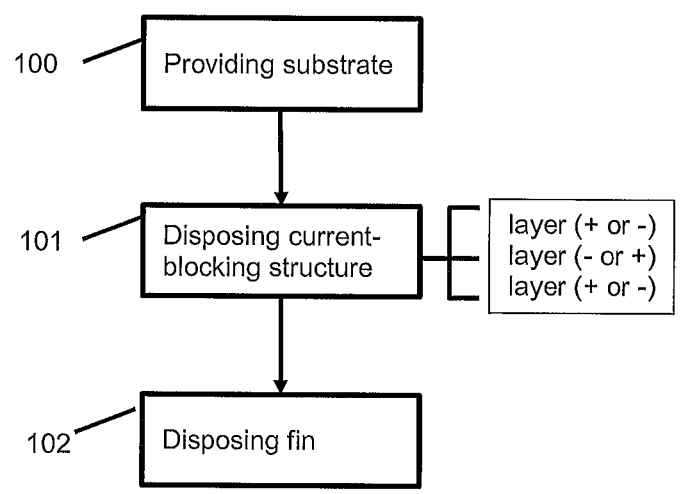
FIG. 9 is a flow chart showing the processes of a method according to an embodiment of the second aspect of the present disclosure.

FIG. 9 is a flowchart showing synthetically the main processes of a method according to the second aspect of the present disclosure. In a first step 100, a semiconductor substrate 2 is provided. In a second step 101, a current-blocking structure 3 is disposed on the semiconductor substrate. This structure 3 comprises a first layer 4 of a first conductive type, a layer 5 of a second conductive type overlaying the first layer 4, and a second layer 6 of the first conductive type overlying the layer 5 of the second conductive type. In a third step 102, at least one vertical semiconductor fin 7 is disposed on the current-blocking structure 3, wherein said fin 7 has a first side 8 and a second side 9, substantially parallel and opposite to each other. This fin 7 comprises a doped bottom portion 10 contacting the current-blocking structure 3, a doped top portion 11 opposite to the doped bottom portion 10, and an undoped portion 12 present between the doped bottom portion 10 and the doped top portion 11.

It is to be understood that although various embodiments, specific constructions and configurations, as well as materials, have been discussed herein for devices according to the present disclosure, various changes or modifications in form and detail may be made without departing from the scope and spirit of the embodiments. For example, any formulas given above are merely representative of procedures that may be used. Functionality may be added or deleted from the block diagrams and operations may be interchanged among functional blocks. Steps may be added or deleted to methods described within the scope of the various embodiments.

What is claimed is:

1. A vertical FinFET semiconductor device, comprising:
   a semiconductor substrate that is not formed of silicon on insulator (SOI);
   a current-blocking structure formed over the semiconductor substrate an extending in a lateral direction, the current-blocking structure comprising:
     a first layer of a first conductive type,
     a layer of a second conductive type over the first layer, and
     a second layer of the first conductive type over the layer of the second conductive type; and
   at least one semiconductor fin formed on the current-blocking structure and extending in a vertical direction, wherein the semiconductor fin has a first side and a second side opposing and substantially parallel to each other, and wherein the semiconductor fin comprises:
     a doped bottom portion contacting the second layer of the current-blocking structure,
     a doped top portion formed vertically opposite to the doped bottom portion, and
     a channel portion vertically interposed between the doped bottom portion and the doped top portion.

2. The vertical FinFET semiconductor device according to claim 1, wherein the semiconductor fin has a thickness in a range between about 2 nm and about 6 nm.

3. The vertical FinFET semiconductor device according to claim 2, further comprising a gate electrode formed on the first side of the semiconductor fin and extending in the vertical direction, wherein the gate electrode is separated from the semiconductor fin by a gate dielectric.

4. The vertical FinFET semiconductor device according to claim 3, wherein the gate electrode is formed only on the first side of the semiconductor fin.

5. The vertical FinFET semiconductor device according to claim 3, further comprising a bottom electrode formed on and contacting the doped bottom portion of the semiconductor fin at least on the second side.

6. The vertical FinFET semiconductor device according to claim 5, wherein the bottom electrode is formed only on the second side of the semiconductor fin, such that the gate electrode and the bottom electrode are formed on opposite sides of the semiconductor fin.

7. The vertical FinFET semiconductor device according to claim 5, further comprising a gate contact connected to the gate electrode and a bottom contact connected to the bottom electrode, wherein the gate contact and the bottom contact are formed on opposite sides of the semiconductor fin.

8. The vertical FinFET semiconductor device according to claim 5, further comprising a gate contact connected to the gate electrode and a bottom contact connected to the bottom electrode, wherein the gate contact and the bottom contact are formed on a same side of the semiconductor fin.

9. The vertical FinFET semiconductor device according to claim 5, wherein the bottom contact is situated in a prolongation of the length of the semiconductor fin.

10. The vertical FinFET semiconductor device according to claim 3, further comprising a gate electrode formed on all vertically extending sides of the channel portion such that the gate electrode surrounds the semiconductor fin, the gate electrode separated from the semiconductor fin by a gate dielectric on all vertically extending sides of the semiconductor fin.

11. The vertical FinFET semiconductor device according to claim 10, further comprising a bottom electrode formed on all vertically extending sides of the doped bottom portion such that the bottom electrode surrounds the semiconductor fin.

12. The vertical FinFET semiconductor device according to claim 1, wherein the substrate is a monocrystalline semiconductor substrate.

13. The vertical FinFET semiconductor device according to claim 1, wherein the semiconductor fin and the substrate are formed of a monocrystalline semiconductor material and are epitaxially aligned to each other.

14. The vertical FinFET semiconductor device according to claim 1, wherein each of the doped bottom portion and the doped top portion is homogeneously doped.

15. The vertical FinFET semiconductor device according to claim 14, wherein boundaries between the channel portion and the doped bottom portion and between the channel portion and the doped top portion are abruptly defined.

16. The vertical FinFET semiconductor device according to claim 14, wherein each of the doped bottom portion, the channel portion and the doped top portion is homogeneously doped with a same dopant such that the semiconductor device is a junctionless FinFET device semiconductor device that does not have a semiconductor junction formed between the channel portion and the doped bottom portion or between the channel portion and the doped top portion.

17. A vertical FinFET semiconductor device, comprising:
   a semiconductor substrate;
   a current-blocking structure formed over the semiconductor substrate and extending in a lateral direction, the current-blocking structure comprising:
     a first layer of a first conductive type,
     a layer of a second conductive type over the first layer, and
     a second layer of the first conductive type over the layer of the second conductive type;

at least one semiconductor fin formed on the current-blocking structure and extending in a vertical direction, wherein the semiconductor fin has a first side and a second side opposing and substantially parallel to each other, and wherein the semiconductor fin comprises:
   a doped bottom portion contacting the second layer of the current-blocking structure,
   a doped top portion formed vertically opposite to the doped bottom portion, and
   a channel portion vertically interposed between the doped bottom portion and the doped top portion; and
a top electrode disposed on the doped top portion of the semiconductor fin.

18. A vertical FinFET semiconductor device, comprising:
a semiconductor substrate;
a current-blocking structure formed over the semiconductor substrate and extending in a lateral direction, the current-blocking structure comprising:
   a first layer of a first conductive type,
   a layer of a second conductive type over the first layer, and
   a second layer of the first conductive type over the layer of the second conductive type; and
a plurality of semiconductor fins formed on the current-blocking structure, wherein each semiconductor fin extends in a vertical direction and has a first side and a second side opposing and substantially parallel to each other, and wherein each of the semiconductor fins comprises:
   a doped bottom portion contacting the second layer of the current-blocking structure,
   a doped top portion formed vertically opposite to the doped bottom portion, and
   a channel portion vertically interposed between the doped bottom portion and the doped top portion,
wherein the plurality of semiconductor fins share a common gate electrode, a common bottom electrode and a common top electrode.

* * * * *